US007539600B2

(12) United States Patent
Pfundlin et al.

(10) Patent No.: US 7,539,600 B2
(45) Date of Patent: May 26, 2009

(54) TRANSMITTER

(75) Inventors: Elmar Pfundlin, Lorrach (DE); Georg Schneider, Schopfheim (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 0 days.

(21) Appl. No.: 11/540,755

(22) Filed: Oct. 2, 2006

(65) Prior Publication Data

US 2007/0073523 A1 Mar. 29, 2007

Related U.S. Application Data

(62) Division of application No. 10/500,857, filed as application No. PCT/EP02/14607 on Dec. 20, 2002, now Pat. No. 7,139,683.

(30) Foreign Application Priority Data

Jan. 18, 2002 (DE) ................................ 102 02 028

(51) Int. Cl.
*H03F 1/26* (2006.01)
*G08B 29/00* (2006.01)

(52) U.S. Cl. ....................................... 702/189; 340/516

(58) Field of Classification Search ................. 702/189, 702/188, 182–185, 190–193; 324/500, 512; 340/516
See application file for complete search history.

(56) References Cited

U.S. PATENT DOCUMENTS

| | | | | |
|---|---|---|---|---|
| 4,783,659 | A | 11/1988 | Frick | 340/870.37 |
| 4,804,958 | A | 2/1989 | Longsdorf | 340/870.07 |
| 5,432,711 | A * | 7/1995 | Jackson et al. | 700/2 |
| 5,452,465 | A * | 9/1995 | Geller et al. | 709/217 |
| 5,956,663 | A * | 9/1999 | Eryurek | 702/183 |
| 6,295,875 | B1 * | 10/2001 | Frick et al. | 73/718 |
| 6,568,279 | B2 * | 5/2003 | Behm et al. | 73/756 |
| 6,853,920 | B2 * | 2/2005 | Hsiung et al. | 702/1 |
| 6,865,509 | B1 * | 3/2005 | Hsiung et al. | 702/182 |
| 2002/0082799 | A1 * | 6/2002 | Pramanik | 702/130 |
| 2003/0209893 | A1 | 11/2003 | Breed | 280/735 |

OTHER PUBLICATIONS

Lazzaroni et al., Remote Measurement and Monitoring of Critical Washing Process Data Directly Inside the Washing Machine Drum, 2000 IEEE, pp. 478-482.*

Lohiya et al., Design of Profibus Compatible Smart Transmitter, 1998 IEEE, pp. 365-368.*

* cited by examiner

*Primary Examiner*—Michael P. Nghiem
*Assistant Examiner*—Toan M Le
(74) *Attorney, Agent, or Firm*—Bacon + Thomas, PLLC

(57) ABSTRACT

A transmitter including: a sensor, which serves for registering a physical parameter (X) and transducing such into an electrical quantity; a signal pre-processor, which serves for converting the electrical quantity into a raw signal (R); a signal processor, which serves for converting the raw signal (R) into a measurement signal (M); an output stage, which serves for issuing an output signal corresponding to the measurement signal (M); and a monitoring unit, which in operation compares the output signal with an auxiliary signal (H) derived from the raw signal (R) and triggers a safety-directed adjustment of the output signal, when a difference between the output signal and the auxiliary signal (H) exceeds a predetermined limit.

6 Claims, 2 Drawing Sheets

TRANSMITTER

FIELD OF THE INVENTION

This application is a Divisional of U.S. application Ser. No. 10/500,857 filed on Mar. 7, 2005, now U.S. Pat. No. 7,139,683 which is the national stage proceeding of PCT/EP02/14607 filed on Dec. 20, 2002 and now U.S. Pat. No. 7,139,683, issued Nov. 21, 2006.

BACKGROUND OF THE INVENTION

The invention relates to a transmitter having a sensor, which serves for registering a physical parameter and for transducing such into an electrical quantity, a signal pre-processor, which serves for converting the electrical quantity into a raw signal, a signal processor, which serves for converting the raw signal into a measurement signal, and an output stage, which serves for issuing an output signal corresponding to the measurement signal.

In the case of applications common in measurements and control technology, for instance for the monitoring, control and/or automation of complex processes, a multiplicity of transmitters are used, e.g. pressure-, temperature-, flow- and/or fill-level-transmitters.

A transmitter is composed, as a rule, of a sensor, which registers a physical parameter and transduces such into an electrical quantity, and an electronics component, which converts the electrical quantity into a measurement signal, which is then issued by an output stage in the form of an output signal.

The measurement signals are usually registered by a superordinated unit, e.g. a control and/or regulating unit. The superordinated unit delivers, as a function of the instantaneous measurement values, display-, control- and/or regulating-signals for the monitoring, control and/or automating of a process. Examples herefor are programmable logic controllers (PLC), process control systems (PCS) or personal computers (PC).

In the case of conventional transmitters, the physical quantity is registered by the sensor and converted into a raw signal by a signal pre-processor. From the raw signal, the measurement signal is won in a signal processor and fed to an output stage, which issues a corresponding output signal.

In the processing of the pre-processed raw signals, errors can occur, which remain unrecognized in the case of conventional transmitters.

In the transmitters of today, microprocessors are frequently used for signal processing and, for example, for implementing customer-specific transfer functions. When using software, problems can arise e.g. due to hidden software errors, which can lead to erroneous output signals or, in the worst case, even to a freeze-up of the output signal.

SUMMARY OF THE INVENTION

It is an object of the invention to provide a transmitter that permits recognition of errors occurring in the processing of the raw signal.

To this end, the invention resides in a transmitter having a sensor, which serves for registering a physical parameter and transducing such into an electrical quantity, a signal pre-processor, which serves for converting the electrical quantity into a raw signal, a signal processor, which serves for converting the raw signal into a measurement signal, an output stage, which serves for issuing an output signal corresponding to the measurement signal, and a monitoring unit, which in operation compares the output signal with an auxiliary signal derived from the raw signal and triggers a safety-directed adjustment of the output signal, when a difference between the output signal and the auxiliary signal exceeds a predetermined limit.

In one embodiment, the output stage issues an analog output signal, which is taken across a resistor, which is fed to the monitoring unit, and which is registered in the monitoring unit by means of a measuring circuit.

In one embodiment, the transmitter includes an electronic unit, which serves for processing the fed measurement signal according to an application-specific transfer function.

In one embodiment, an adjustment of a zero-point and a scaling of the measurement signal is accomplished by the application-specific transfer function.

In a further development, the monitoring unit includes a second electronic unit, the transfer function is stored in a memory assigned to the unit, the second electronic unit derives, during operation, the auxiliary signal from the raw signal, by processing the raw signal according to the application-specific transfer function, and compares the processed raw signal with the output signal.

In a further development, the safety-directed adjustment of the output signal is an alarm signal.

The invention additionally resides in a method for start-up of a transmitter having first and second electronic units, wherein the transfer function of the user is fed to the first electronic unit via a communication interface, or a transfer function present in the transmitter is chosen, the transfer function is transmitted via a data line from the first electronic unit to the second electronic unit, and is stored in a memory assigned to the second electronic unit.

The invention and further advantages will now be explained in greater detail on the basis of the figures of the drawing illustrating an example of an embodiment of a transmitter; equal elements are provided in the figures with equal reference characters.

DETAILED DESCRIPTION OF THE DRAWINGS

Figure 1:
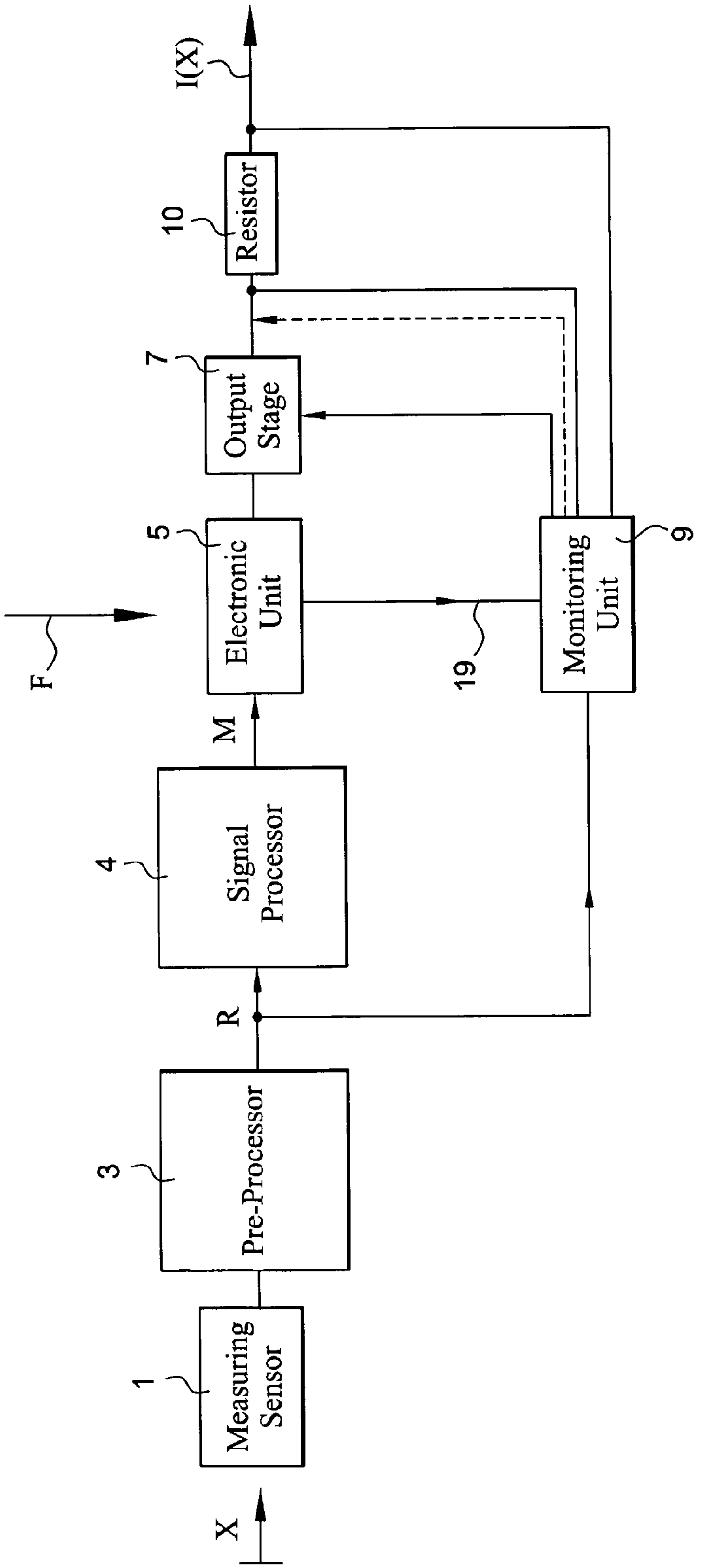
FIG. 1 shows a block diagram of a transmitter of the invention.

The transmitter contains a measuring sensor 1, which serves for registering a physical parameter X and transducing such into an electrical quantity. The sensor can be e.g. a pressure-, temperature-, flow-, or fill-level-sensor. The physical parameter X affects the measuring sensor 1, and the sensor, in turn, issues an electrical quantity corresponding to a present, measured value of the physical parameter X. The electrical quantity is fed to a signal pre-processor 3 serving for converting the electrical quantity into a raw signal R, which is available for a further processing and/or evaluation. For this, the electrical quantity is e.g. amplified and/or filtered.

The raw signal R is converted into a measurement signal M by a following signal processor 4. Here, e.g. compensation of a possible temperature dependence of the raw signal is done.

Also, corrections and adjustments resulting from e.g. sensor-specific characteristic curves or compensation- and/or calibration-data can be cared for.

The measurement signal M is applied to an electronic unit 5, e.g. a microprocessor, which processes the measurement signal M in accordance with an application-specific transfer function F. Here, e.g. a zero-point of the physical quantity desired by the user and a scaling of the measured value, e.g. in the form of a measurement range specification, or the units, in which a result of measurement is to be issued, are cared for.

The measurement signal processed according to the transfer function F is applied to an output stage 7, which issues an output signal corresponding to the measurement signal M. An output signal can e.g. be a current corresponding to the presently measured value, a voltage corresponding to the presently measured value, or a digital signal. In the illustrated example of an embodiment, the output signal is a current I(X) changing as a function of the physical parameter X.

Figure 2:
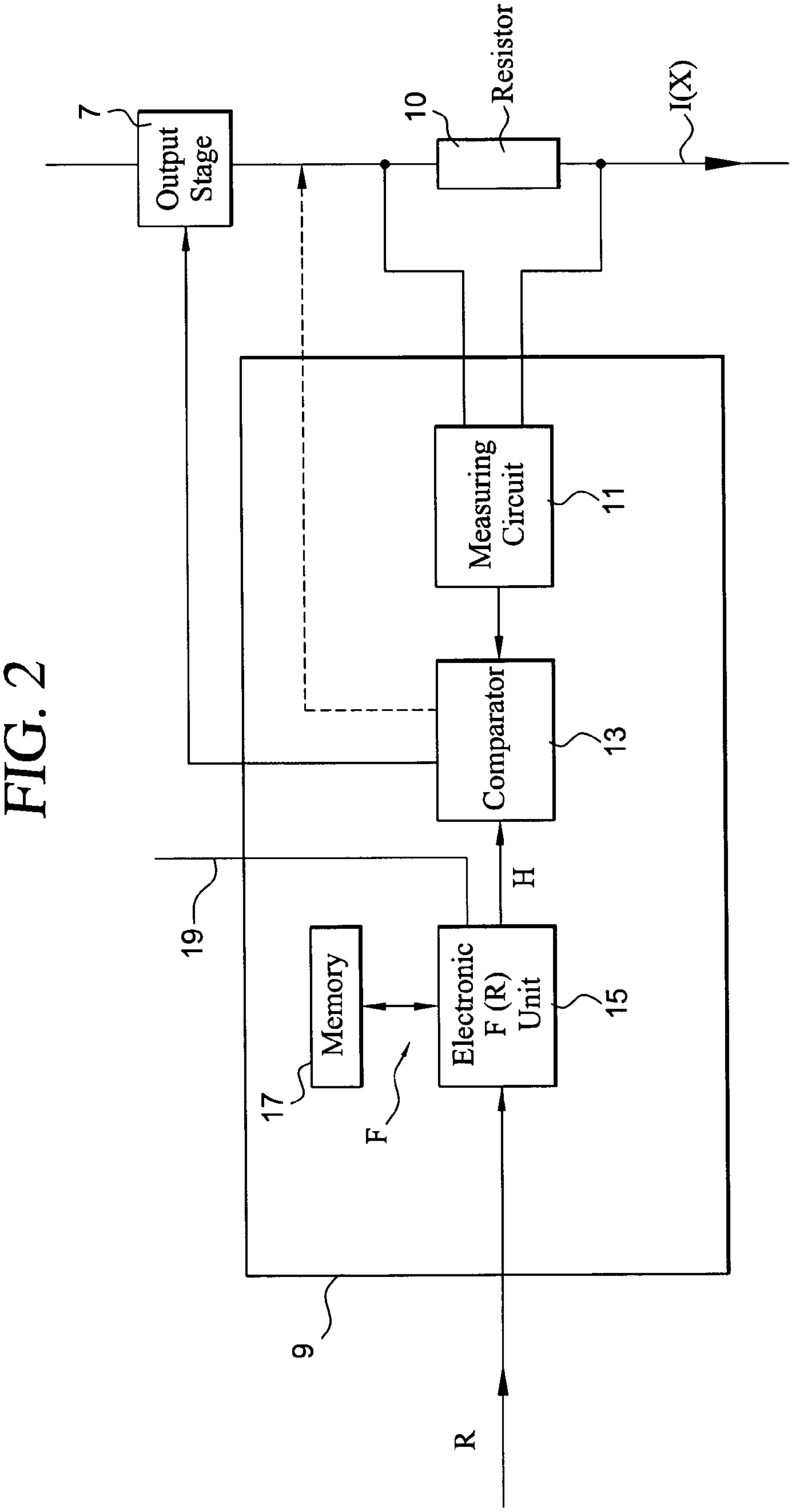
FIG. 2 shows the monitoring unit indicated in FIG. 1.

A monitoring unit 9 is provided in parallel with the signal processing path formed by the signal processor 4, the electronic unit 5 and the output stage 7. FIG. 2 shows an example of an embodiment for a construction of the monitoring unit 9.

The monitoring unit 9 has a first input, to which the raw signal R is applied.

In operation, the monitoring unit 9 compares the output signal with an auxiliary signal H derived from the raw signal R and effects a safety-directed adjustment of the output signal, when a difference between the output signal and the raw signal R exceeds a predetermined level. The raw signal R is naturally less exact than the output signal. For this reason, preferably a tolerable difference between auxiliary signal H and output signal is defined, such as can occur because of the different accuracies of the two signals. If the difference between the two signals exceeds this limit, then a malfunction has occurred, which is immediately recognized by the transmitter embodied according to the invention. Correspondingly, the transmitter can then effect a safety-directed adjustment of the output signal.

The operator is warned by the transmitter and it is assured that no major damage can be caused, before the error is corrected.

In the illustrated example of an embodiment using an analog output signal, a 10 is located in the output branch, and the output signal is taken from across the resistor 10 and fed to the monitoring unit. The monitoring unit 9 has a measuring circuit 11, in which the output signal is registered and fed to a comparator 13.

Preferably, the monitoring unit also has an electronic unit 15, e.g. a second microprocessor, which derives the auxiliary signal H from the raw signal R, by processing the raw signal R according to the application-specific transfer function F. The electronic unit 15 compares the so-won auxiliary signal H with the present output signal.

In this connection, the electronic unit 15 is assigned a memory 17, in which the transfer function F is stored.

During start-up of a transmitter of the invention, preferably the transfer function F is fed in a first step by the user via a communication interface to the first electronic unit 5 in the signal processing branch. Alternatively, a transfer function present in the transmitter can also be selected by the user. This can, for example, transpire by way of a menu permitting selection of the different measuring ranges, signal output modes, units in which the measurement is to be given, etc.

The communication interface is merely symbolically indicated in FIG. 1 by means of an arrow. Although here a communication interface is spoken of, with some transmitters also a simple unidirectional transfer of the transfer function F to the electronic unit 5 can be sufficient. This does not have to happen via a separate interface, it can occur also over the lines that are used to supply the transmitter and/or over those on which the output signal is issued.

From the first electronic unit 5, the transfer function F is transferred once over a data line 19 from the first to the second electronic unit 5, 15 and stored in a memory 17 assigned to the second electronic unit 15.

In a transmitter of the invention, the entire signal processing branch is monitored. Any kind of error occurring therein is immediately noticed, and the transmitter reacts automatically in a safety-directed manner.

This occurs e.g. in that the electronic unit 15 of the monitoring unit 9 effects a corresponding adjustment over the output stage 7. This is indicated in FIGS. 1 and 2 by a continuous line. Alternatively, the monitoring unit 9 can naturally act on the output signal directly. In the case of the described electrical-current output, this could be effected such that the monitoring unit 9 acts on the output signal between the output stage and the resistance 10 so that the output signal assumes the desired safety-directed adjustment. This is shown in the figures by the dashed line.

A safety-directed adjustment of the output signal can e.g. be an alarm signal. In the described analog current output, an alarm signal can e.g. be the regulating of the current to a value which it does not assume under normal measurement conditions. If the currents for the measurement existing at the time lie between 4 mA and 20 mA in error-free operation, then currents above 20 mA, respectively below 4 mA, can have the meaning of an alarm.

Alternatively, a safety-directed adjustment can, naturally, also mean that an output signal is set, which corresponds to a measured value at which the least possible damage is triggered by the malfunctioning transmitter. For example, in the case of a fill level measurement, a safety-directed adjustment can mean that the transmitter, which has recognized its malfunction, reports, independently of the actual fill level, that the container is full, in order that no more fill substance be introduced into the container. In this way, an overflow of the container is prevented. Additionally to this adjustment, an alarm signal is advantageously superimposed on the output signal.

The invention claimed is:

1. A method for start-up of a transmitter, comprising the steps of:

feeding a user-defined transfer function (F) to a first electronic unit via a communication interface transmitting the transfer function (F) via a data line from the first electronic unit to a second electronic unit, thereby controlling said second electronic unit; and storing said transfer function (F) in a memory assigned to the second electronic unit, wherein:

said transmitter, comprises a sensor, which serves for registering a physical parameter (X) and transducing such into an electrical quantity;

a signal pre-processor connected to said sensor, which serves for converting the electrical quantity into a raw signal (R);

a signal processor connected to said signal pre-processor, which serves for converting the raw signal (R) into a measurement signal (M);

an output stage, which serves for issuing an output signal corresponding to the measurement signal (M); and a monitoring unit connected to said signal pre-processor, to said signal processor, and to said output stage which in operation compares the output signal with an auxiliary signal (H) derived from the raw signal (R) and triggers a safety-directed adjustment of the output signal, when a difference between the output signal and the auxiliary signal (H) exceeds a predetermined limit, wherein the transmitter further comprises an electronic unit, which serves for processing the fed measurement signal (M) according to said transfer function (F).

2. The method as claimed in claim 1, wherein:

an adjustment of a zero-point and a scaling of a measurement signal (M) is accomplished by the transfer function (F).

3. The method according to claim 1, wherein the transfer function (F) is application-specific.

4. A method for start-up of a transmitter, comprising the steps of:

selecting a user-defined transfer function (F) present in the transmitter and feeding the user-defined transfer function (F) to a first electronic unit transmitting the transfer function (F) via a data line from the first electronic unit to a second electronic unit, thereby controlling said second electronic unit; and storing said transfer function (F) in a memory assigned to the second electronic unit, wherein:

said transmitter, comprises a sensor, which serves for registering a physical parameter (X) and transducing such into an electrical quantity;

a signal pre-processor connected to said sensor, which serves for converting the electrical quantity into a raw signal (R);

a signal processor connected to said signal pre-processor, which serves for converting the raw signal (R) into a measurement signal (M);

an output stage, which serves for issuing an output signal corresponding to the measurement signal (M); and a monitoring unit connected to said signal pre-processor, to said signal processor, and to said output stage which in operation compares the output signal with an auxiliary signal (H) derived from the raw signal (R) and triggers a safety-directed adjustment of the output signal, when a difference between the output signal and the auxiliary signal (H) exceeds a predetermined limit, wherein the transmitter further comprises an electronic unit, which serves for processing the fed measurement signal (M) according to said transfer function (F).

5. The method as claimed in claim 4, wherein:

an adjustment of a zero-point and a scaling of a measurement signal (M) is accomplished by the transfer function (F).

6. The method according to claim 4, wherein the transfer function (F) is application-specific.

* * * * *